(12) United States Patent
Hsieh et al.

(10) Patent No.: US 6,326,662 B1
(45) Date of Patent: Dec. 4, 2001

(54) SPLIT GATE FLASH MEMORY DEVICE WITH SOURCE LINE

(75) Inventors: Chia-Ta Hsieh, Tainen; Chrong Jung Lin, Taipei; Shui-Hung Chen, Hsin-Chu; Di-Son Kuo, Hsinchu, all of (TW)

(73) Assignee: Taiwan Semiconductor Manufacturing Company, Hsin-Chu (TW)

(*) Notice: Subject to any disclaimer, the term of this patent is extended or adjusted under 35 U.S.C. 154(b) by 0 days.

(21) Appl. No.: 09/633,643

(22) Filed: Aug. 7, 2000

Related U.S. Application Data

(62) Division of application No. 09/133,969, filed on Aug. 14, 1998, now Pat. No. 6,133,097.

(51) Int. Cl.[7] ................................................. H01L 29/788
(52) U.S. Cl. ............................................................ 257/316
(58) Field of Search ...................................... 438/251, 257; 257/261, 314, 315, 317, 319, 321

(56) References Cited

U.S. PATENT DOCUMENTS

| | | | |
|---|---|---|---|
| 5,103,274 | 4/1992 | Tang et al. | 257/401 |
| 5,120,671 | 6/1992 | Tang et al. | 438/251 |
| 5,412,238 | 5/1995 | Chang | 257/321 |
| 5,466,624 | 11/1995 | Ong et al. | 438/263 |
| 5,597,751 | 1/1997 | Wang | 438/261 |
| 5,656,513 | 8/1997 | Wang et al. | 438/262 |
| 5,940,706 | 8/1999 | Sung et al. | 438/261 |
| 6,097,059 | 8/2000 | Yamada | 257/321 |
| 6,124,609 | * 9/2000 | Hsieh et al. | 257/315 |
| 6,188,103 | 3/2001 | Hsieh et al. | 257/316 |

* cited by examiner

*Primary Examiner*—Long Pham
*Assistant Examiner*—William David Coleman
(74) *Attorney, Agent, or Firm*—George O. Saile; Stephen B. Ackerman; Graham S. Jones, II

(57) ABSTRACT

A method of forming split gate electrode MOSFET devices comprises the following steps. Form a tunnel oxide layer over a semiconductor substrate. Form a floating gate electrode layer over the tunnel oxide layer. Form a masking cap over the floating gate electrode layer. Pattern gate electrode stacks formed by the tunnel oxide layer and the floating gate electrode layer in the pattern of the masking cap. Pattern source line slots in the center of the gate electrode stacks down to the substrate. Form source regions at the base of the source lines slots. Form intermetal dielectric and control gate layers over the substrate covering the stacks. Pattern the intermetal dielectric and control gate layers into adjacent mirror image split gate electrode pairs. Form self-aligned drain regions.

10 Claims, 11 Drawing Sheets

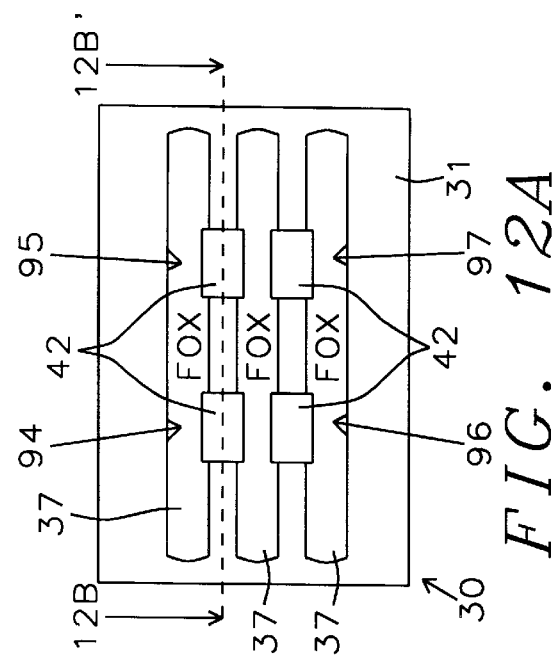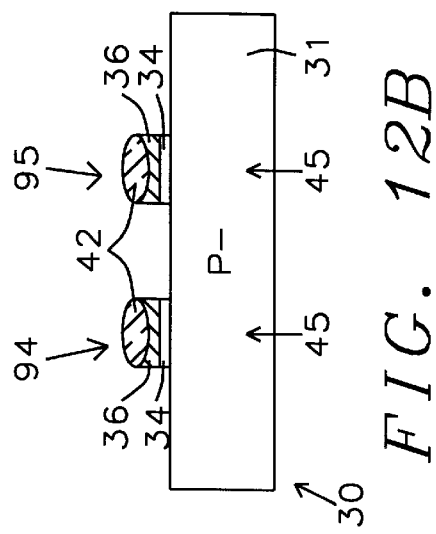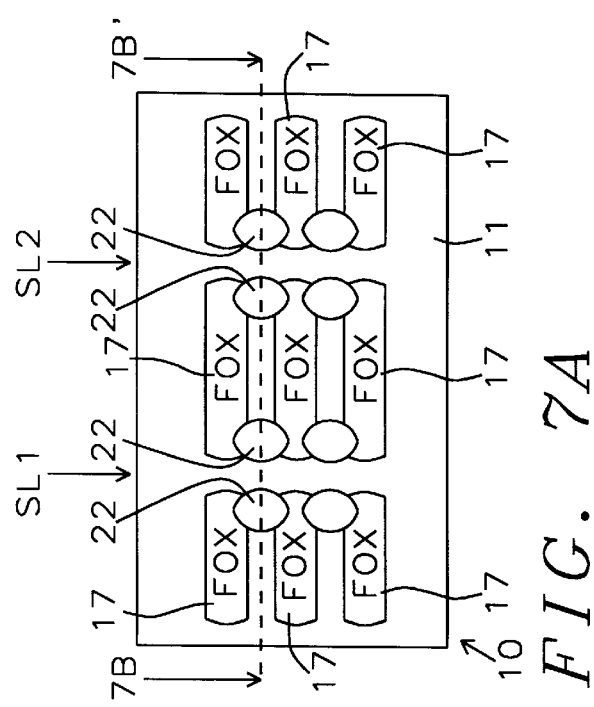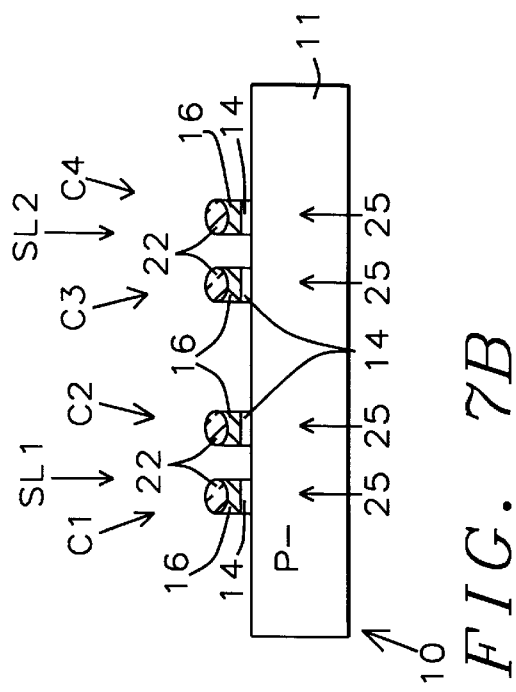

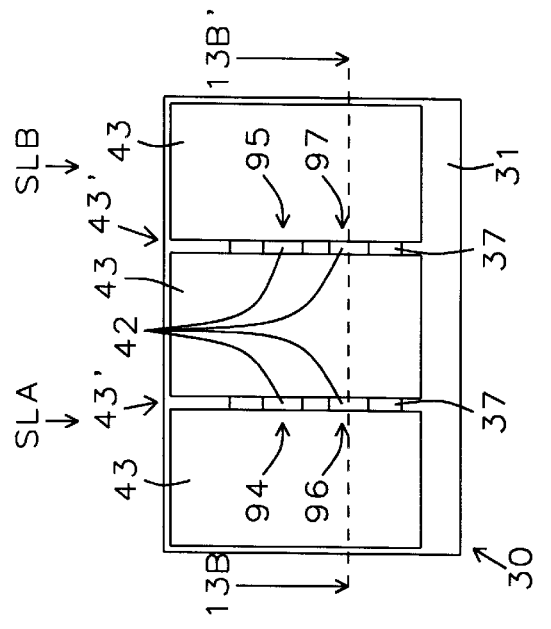
FIG. 13A
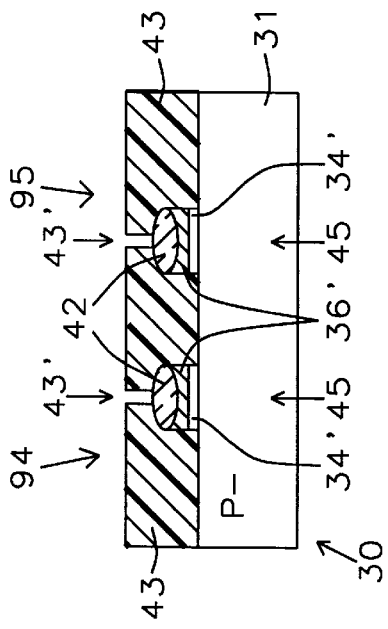
FIG. 13B
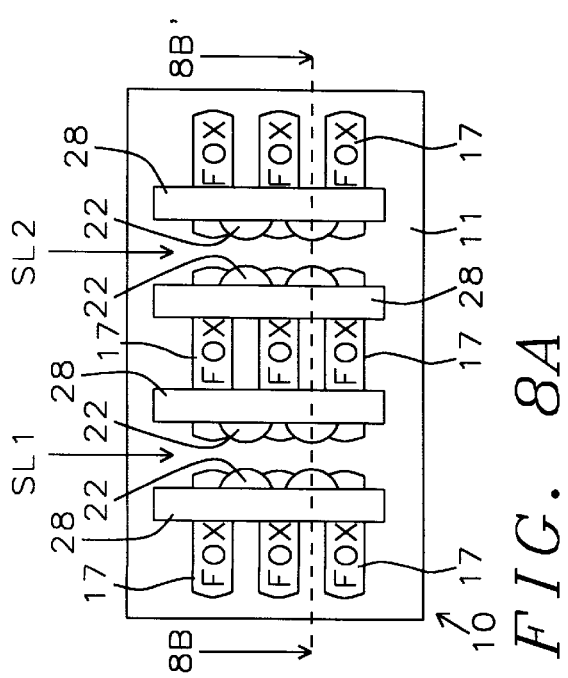
FIG. 8A
FIG. 8B

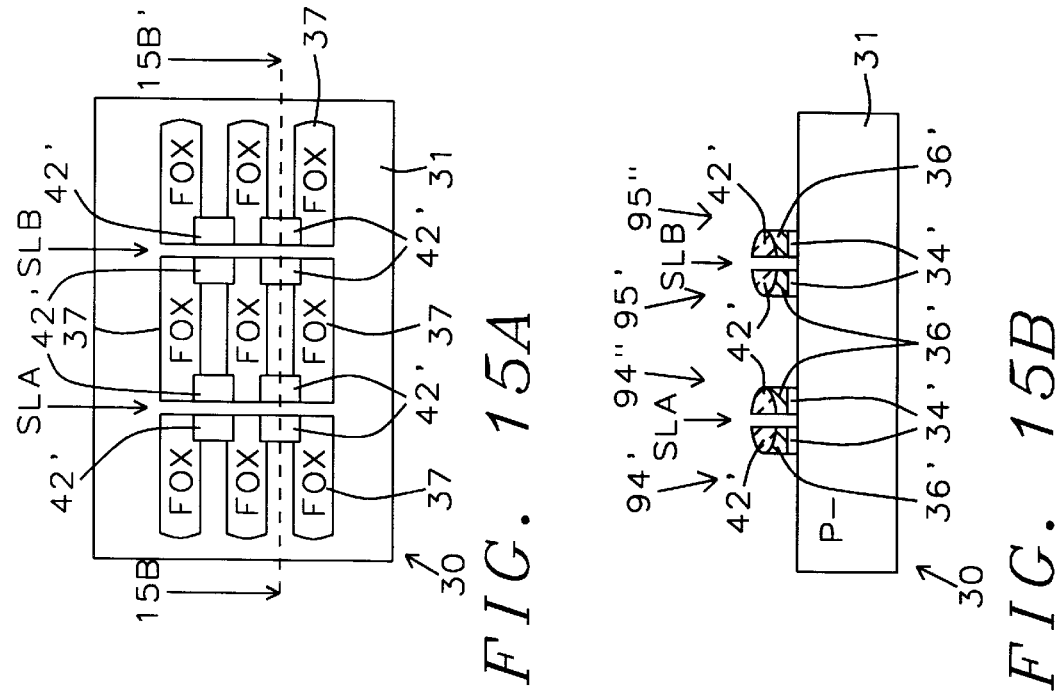
FIG. 14A
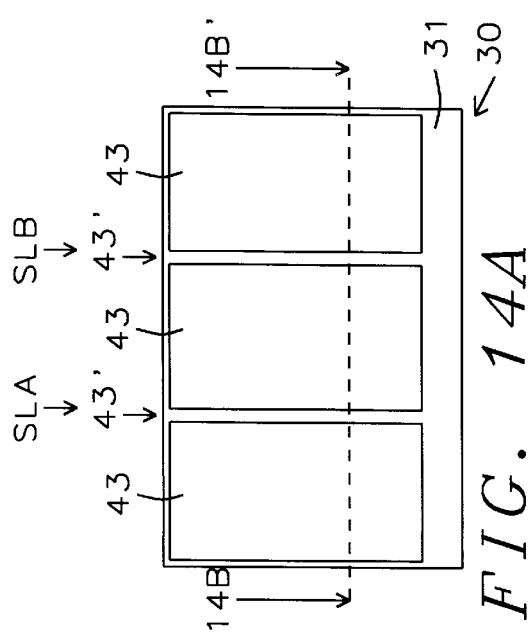
FIG. 14B
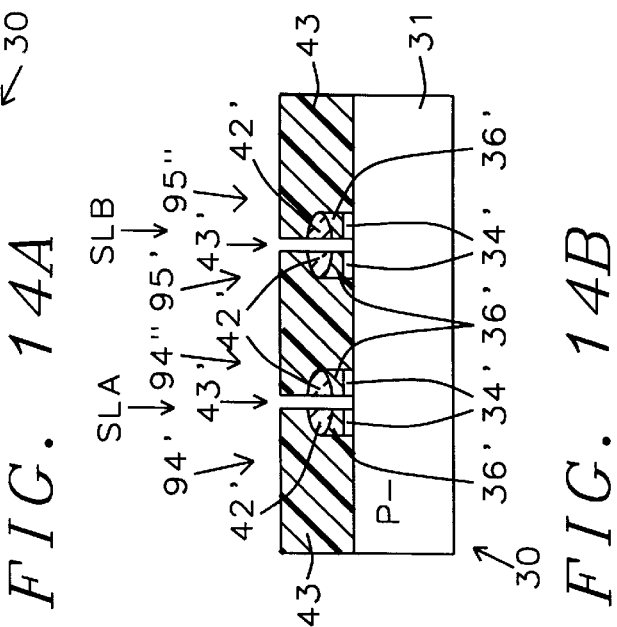
FIG. 15A
FIG. 15B

SPLIT GATE FLASH MEMORY DEVICE WITH SOURCE LINE

This is a division of patent application Ser. No. 09/133,969, filing date Aug. 14, 1998, now U.S. Pat. No. 6,133,097 Method For Shrinking Array Dimensions Of Split Gate Flash Memory Device Using One Mask Defining Cell And Source Line & Device Manufactured Thereby, assigned to the same assignee as the present invention.

BACKGROUND OF THE INVENTION

1. Field of the Invention

This invention relates to semiconductor devices and more particularly to MOSFET (Metal Oxide Semiconductor Field Effect Transistor) memory devices and methods of manufacture thereof.

2. Description of Related Art

U.S. Pat. No. 5,103,274 of Tang et al. for "Self-Aligned Source Process and Apparatus" shows a method of forming self-aligning source region EPROM, flash EPROM and EEPROM memory devices.

U.S. Pat. No. 5,120,671 of Tang et al. for "Process for Self-Aligning a Source Region with a Field Oxide Region and a Polysilicon Gate" also shows a method of forming self-aligning source region EPROM, flash EPROM and EEPROM memory devices.

See U.S. Pat. No. 5,656,513 of Wang et al. for "Nonvolatile Memory Cell Formed Using Self-Aligning Source Implant".

Also see U.S. Pat. No. 5,466,624 of Ong et al. for "Isolation Between Diffusion Lines in a Memory Array".

SUMMARY OF THE INVENTION

In accordance with this invention, the split gate electrode MOSFET devices comprises a tunnel oxide layer over a semiconductor substrate, a floating gate electrode layer over the tunnel oxide layer, and a pattern of adjacent caps over the floating gate electrode layer. There are adjacent gate electrode stacks formed from the tunnel oxide layer and the floating gate electrode layer in the pattern of the caps. Intermetal dielectric and control gate layers overlie the substrate, covering the stacks. The intermetal dielectric and control gate layers are patterned into adjacent mirror image split gate electrode pairs. Source regions and drain regions are self-aligned with the gate electrode stacks and split gate electrode pairs.

Preferably, the floating gate electrode layer comprises a doped polysilicon layer; and the caps on the surface of the doped polysilicon comprise polysilicon oxide caps.

Preferably, the floating gate electrode layer comprises a doped polysilicon layer; the slots have a width from about 3500 Å to about 6500 Å; and there are caps on the surface of the doped polysilicon formed into polysilicon oxide caps on the surface of the polysilicon layer.

Preferably, FOX regions are formed in the substrate. Active regions are formed in the substrate below the tunnel oxide layer. The floating gate electrode is formed of doped polysilicon layer. The caps on the surface of the doped polysilicon comprise polysilicon oxide caps on the surface of the polysilicon layer. The tunnel oxide layer and the floating gate electrode layer being in the pattern of the cap.

In accordance with another aspect of this invention, a split gate electrode MOSFET devices includes the following. A tunnel oxide layer overlies a semiconductor substrate. A floating gate electrode layer overlies the tunnel oxide layer and a cap overlies the floating gate electrode layer. A gate electrode stack is formed with the tunnel oxide layer and the floating gate electrode layer in the pattern of the cap. There is a source line slot in the center of the gate electrode stack down to the substrate. A source region is formed in the substrate at the base of the source line slot. There are intermetal dielectric and control gate layers overlying the substrate. The intermetal dielectric and control gate layers comprise adjacent mirror image split gate electrode pairs. Source and drain regions are self-aligned with the gate electrode stack and split gate electrodes pairs.

Preferably, the floating gate electrode comprises a doped polysilicon layer. The slot has a width from about 3500 Å to about 6500 Å. The cap on the surface of the doped polysilicon comprises a polysilicon oxide cap.

Preferably, the floating gate electrode comprises a doped polysilicon layer. The cap on the surface of the doped polysilicon comprises a polysilicon oxide cap on the surface of the polysilicon layer. The tunnel oxide layer and the floating gate electrode layer are patterned in the pattern of the cap.

Preferably, a silicon nitride floating gate mask overlies the polysilicon layer.

This invention provides a method for shrinking array dimensions by one mask defining of cell and source line in a split gate flash memory device. Features of the invention include as follows:

1. The shape of field oxide regions begin with rows of long stripes.
2. Cells are defined by the formation of blocks between long field oxide stripes. Then polysilicon and silicon nitride are etched away and polysilicon oxidation caps are formed for split gate flash memory processing.
3. After silicon nitride removal and polysilicon etching, floating gates are formed basically. Then source lines perpendicular to field oxide stripes are defined, which separate blocks of the floating gate electrode stacks. By the etching of polysilicon oxide, polysilicon and field oxide with one mask, floating gates with self-aligned source regions can be formed, which is easy to scale down the desired cell dimensions.

This invention has the advantages as follows:

1. It improves the photolithography process window in the active region definition to solve the problem of pull back in the head of the field oxide region.
2. It solves the encroachment issue in field oxide, which makes it easy to shrink the active area (OD) design rule.
3. It reduces the encroachment issue in floating gates after polysilicon oxidation.

BRIEF DESCRIPTION OF THE DRAWINGS

The foregoing and other aspects and advantages of this invention are explained and described below with reference to the accompanying drawings, in which:

FIG. 1 is an enlarged view of the device shown in FIGS. 8A and 8B.

FIG. 4B is a section taken along line 4B–4B' in FIG. 4A.

FIG. 5B is a section taken along line 5B–5B' in FIG. 5A.

FIG. 6B is a section taken along line 6B–6B' in FIGS. 5A and 6A.

FIGS. 7A and 7B show the device of FIGS. 6A and 6B after the floating gate mask was stripped from the surface of device revealing hard mask caps above the floating gate layers which has been patterned by etching. FIG. 7B is a section taken along line 7B–7B' in FIG. 7A which shows a set of floating gate stacks.

FIGS. 8A and 8B show the device of FIGS. 7A and 7B after the formation of self-aligned source/drain regions followed by addition of an InterMetal Dielectric (IMD) layer and a split gate control gate electrode of a flash memory EPROM device.

FIG. 9B is a section taken along line 9B–9B' in FIG. 9A.

FIG. 10B is a section taken along line 10B–10B' in FIG. 10A.

FIG. 11B is a section taken along line 11B–11B' in FIG. 11A.

FIGS. 12A and 12B show the device 30 of FIGS. 11A and 11B after the silicon nitride mask layer 41 was stripped from the surface of device 30. FIG. 12B is a section taken along line 12B–12B' in FIG. 12A showing that floating gate stacks 94 and 95 have been formed.

FIGS. 13A and 13B show the device of FIGS. 12A and 12B in which a source line mask is formed with source line slots therethrough provided in preparation for defining source lines. FIG. 13B is a section taken along line 13B–13B' in FIG. 13A.

FIGS. 14A and 14B show the device of FIGS. 13A and 13B after the IMD caps, floating gate polysilicon layer and tunnel oxide layer and field oxide regions below the source line slots have been etched away to form a slot seen in FIGS. 15A and 15B between separate cells forming a pair of cells from each of the cell blocks. FIG. 14B is a section taken along line 14B–14B' in FIG. 14A.

FIGS. 15A and 15B show the device of FIGS. 14A and 14B after the source line mask has been stripped from the device. In FIG. 15B the new cells stacks formed from cell blocks are shown in section. Since the devices are formed by the formation of slots through the FOX strips, where no encroachment was possible in the middle of the strips, the birds beak sections are substantially eliminated in those portions of the devices. FIG. 15B is a section taken along line 15B–15B' in FIG. 15A.

FIG. 16B is a section taken along line 16B–16B' in FIG. 16A.

DESCRIPTION OF THE PREFERRED EMBODIMENT

Figure 1:
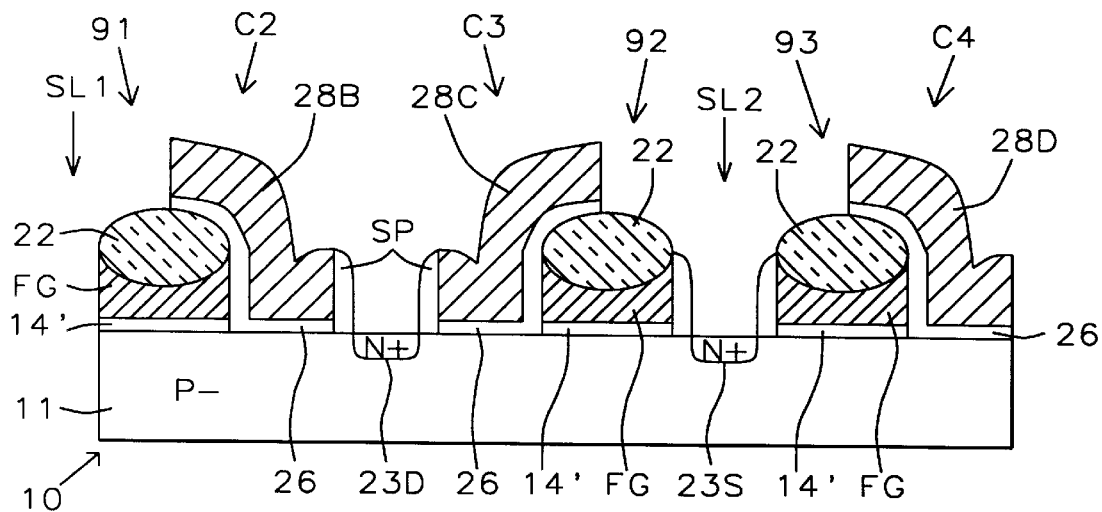
FIG. 1 shows a sectional, elevation view of a portion of a design contemplated in development of this invention with one-and-one-half sets of confronting, split gate, flash memory cells which are separated by a relatively wide gap.

FIG. 1 shows a sectional, elevation view of a portion of a design of a flash memory EPROM device 10 contemplated in development of this invention with one-and-one-half sets of confronting, split gate, flash memory cells which are separated by a relatively wide gap. FIG. 1 is an enlarged view of the device shown in FIGS. 8A and 8B. FIG. 1 shows device 10 with one-and-one-half sets of confronting split gate, flash memory cells C1 and C2 on the left and flash memory cells C3 and C4 on the right side of FIG. 8B separated by a pair of relatively wide source line slots (gaps) SL1 and SL2 respectively. Cells C1, C2, C3 and C4 are formed on a P-doped silicon substrate 12. Above the substrate 11, several floating gate electrode stacks 90, 91, 92 and 93 are formed.

Figure 6A:
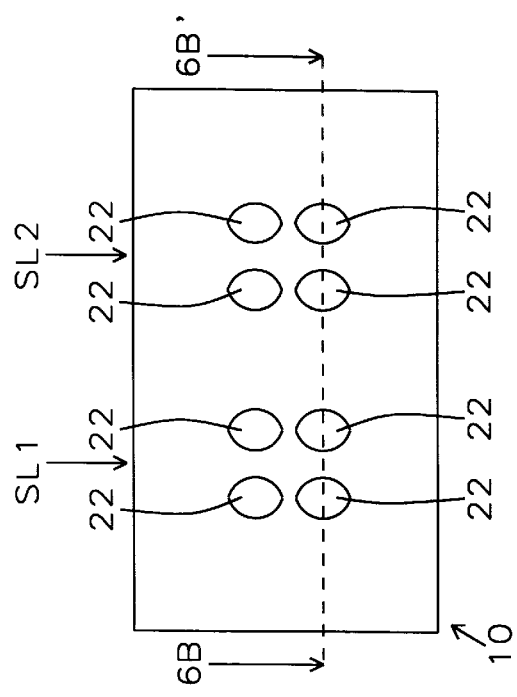
FIGS. 6A and 6B show the device of FIGS. 5A and 5B after the mask and pad oxide layer have been stripped from the substrate, floating gate layers have been formed on the substrate and a polyoxide cap (hard mask) has been formed on the top of the floating gate layers.
Figure 6B:
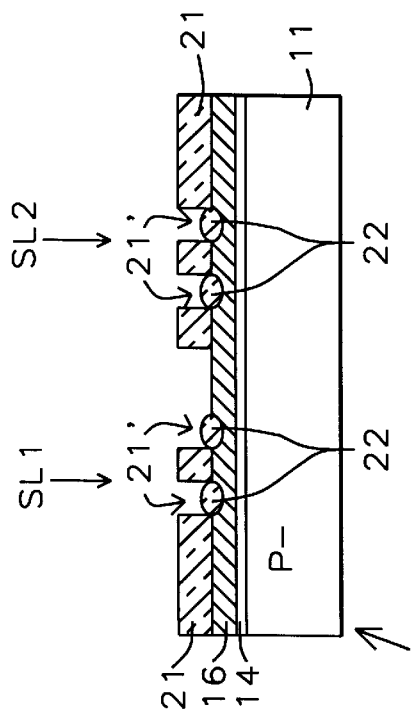

The floating gate electrode stacks 90, 91, 92 and 93 are formed by several layers topped by a pair of polysilicon oxide caps 22, which were used as hard masks 22 during the process of patterning a doped polysilicon layer 16 and a tunnel oxide layer 14 into floating gates FG patterned into the stacks 90, 91, 92 and 93 to form sections of tunnel oxide layer 14' located below caps 22, as seen in FIG. 6B. The result is doped polysilicon floating gate electrodes FG and sections of tunnel oxide layer 14', which were patterned by etching in the pattern of the polysilicon oxide caps 22 as seen in FIG. 7B.

Referring to FIG. 1 and FIG. 8B, the floating gate electrode stacks 90, 91, 92 and 93 are juxtaposed with the source line slots SL1 and SL2. The N+ doped source regions 23S at the base of slots SL1 and SL2 are shared between the juxtaposed stacks 90/91 and 92/93 respectively. Also, Inter-Metal Dielectric (IMD) layer 26 and a set of mirror image split gate control gate electrodes 28B and 28C are formed on opposite sides of the pair of the floating gate electrode stacks 92/93 on the outboard sides thereof, away from slot SL2.

Control gate electrodes 28A/28B and 28C/28D which overlie the IMD layer 26 are formed on the opposite sides of the pair of the floating gate electrode stacks 90/91 and 92/93 respectively on the outboard sides thereof, away from slots SL1/SL2. The IMD layer 26 is formed on the surface of the substrate 11, the outboard sidewalls of the stacks of floating gates FG' and and above an outboard portion of polyoxide caps 22 of cells C1, C2 and C3. Control gate doped polysilicon electrodes 28A, 28B, 28C and 28D are formed over the IMD layer 26 reaching over the outboard sides of stacks 90/91.

Control gate polysilicon layer 28 and IMD layer 26 have the same pattern which was produced by masking and a subtractive process such as selective chemical etching. Note that control gate electrodes 28A, 28B, 28C and 28D are patterned to form mirror image split gate devices from the array of floating gate electrode stacks 90/91 and 92/93.

Thus, a set of four cells C1, C2, C3 and C4 is completed by the addition of layers 26 and 28 to the floating gate stacks, as shown in FIG. 8B.

Referring to FIG. 8B, ion implanted, N+ doped, source region 23S are self-aligned with the floating gate electrodes between the stacks 90/91 of cells C1 and C2 and stacks 92/93 of cells C3 and C4.

Ion implanted, N+ doped, drain regions 23D are formed self-aligned with the control gate electrodes 28B and 28C of cells C2 and C3 adjacent to the outboard edges of electrodes 28B and 28C on the opposite side of the floating gate electrodes FG from the source line slots (gap) SL1/SL2.

By mirror image, in connection with FIG. 1, what is meant is that the split gate control gate electrodes 28B form the first set of electrodes and the second set of electrodes 28C/28D are on the outboard sides of the stacks 90/91 and 91/92 away from the slots (gap) SL1/SL2 and on the outboard sides of the stacks 90/91 and 92/93 away from the slots (gap) SL1/SL2.

Figure 2:
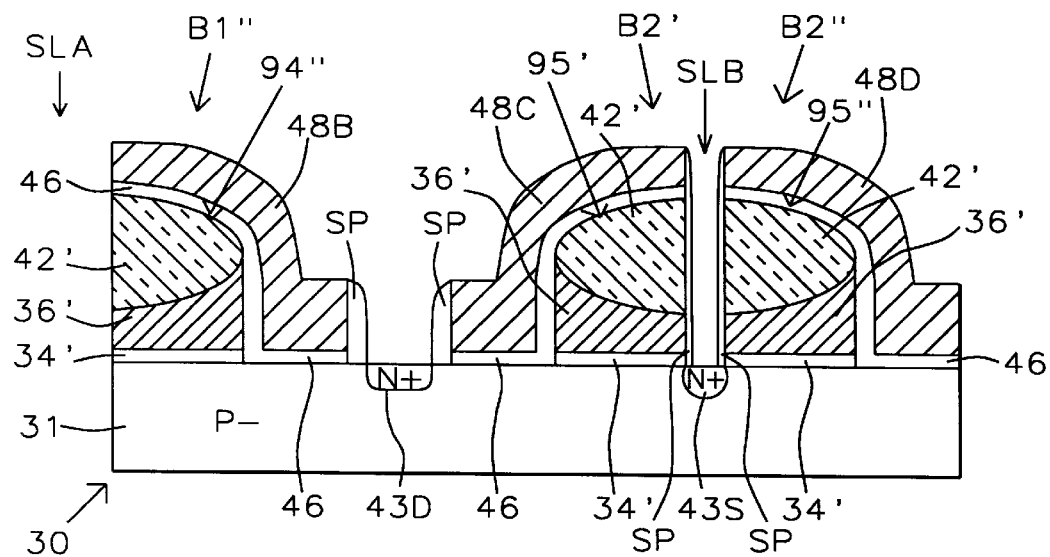
FIG. 2 shows a sectional, elevation view of a portion of a device designed in accordance with this invention shown in an enlarged FIGS. 16A and 16B with one-and-one-half sets of confronting, split gate, flash memory cells which are separated by a very narrow gap.
Figure 16A:
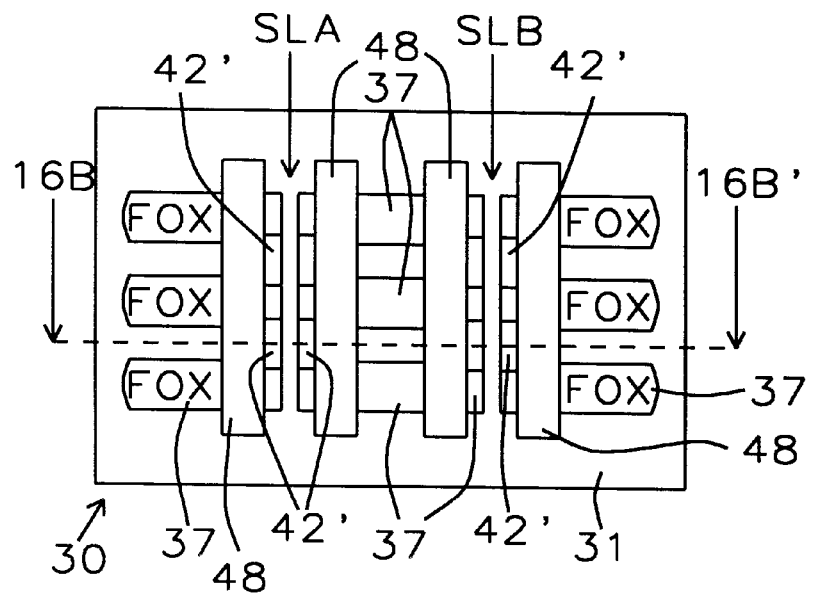
FIGS. 16A and 16B show the device of FIGS. 15A and 15B after the formation of self-aligned source/drain regions. In addition, InterMetal Dielectric (IMD) layer has been formed over the entire device followed by a blanket deposition of the second, control gate polysilicon layer. The control gate electrodes are patterned to form split gate devices from the array of floating gate stacks.
Figure 16B:
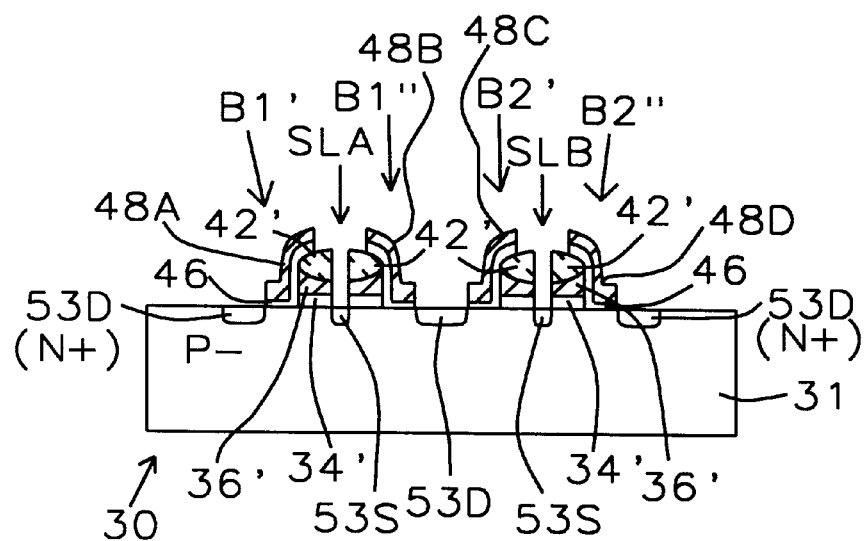

FIG. 2 shows a sectional, elevation view of a portion of a device 30 designed in accordance with this invention shown in an enlarged view of a portion of device 30 of FIGS. 16A and 16B with one-and-one-half sets of confronting, split gate, flash memory cells B1' and B1" which are separated by a very narrow gap. They are separated by slot SLA.

Cells B2' and B2" are separated by slot SLB. Slots SLA and SLB, which are very narrow, have a width from about 3500 Å to about 6500 Å. Cells B1' and B1" are formed on a P– doped silicon substrate 31.

Referring to FIG. 16B, and FIG. 2 which shows an enlarged view of FIG. 16B, above the substrate 31, there are two pairs of bisected mirror-image, juxtaposed floating gate stacks 94'/94" and 95'/95", which have been formed from what was formerly a single stacks 94/95, as described in detail below with reference to FIGS. 9B–15B, which are separated by the trenches SLA/SLB etched to form separate stacks 94' and 94". The tops of stacks 94'/94" and stacks 95'/95" are formed by polysilicon oxide caps 42', which have served as a hard masks 42 in forming the floating gate stacks 94/95 which were later bisected into four stacks 94'/94" and 95'/95". Caps 42' overlie bisected stacks 94'/94" and 95'/95" comprising tunnel oxide layer 34' and doped polysilicon floating gates 36' which were patterned by etching using the original caps 42, used as masks in FIGS. 12/12B. The floating gate electrode bisected stacks 94'/94" and 95'/95" are juxtaposed with the very narrow source line gaps SLA and SLB therebetween. Ion implanted, N+ doped drain regions 43D are formed self-aligned with the split gates 48A, 48B, 48C and 48D. Source regions 43S are formed between floating gate electrode bisected stacks 94'/94" and bisected stacks 95' and 95". The source regions 43S at the base of very narrow gaps SLA and SLB are shared between the juxtaposed, bisected stacks 94'/94" and bisected stacks 95' and 95", respectively.

In addition, InterMetal Dielectric (IMD) layer 46 and a pair of mirror image split gate control gate electrodes 48 are formed on opposite sides of the pair of the floating gate electrode, bisected stacks 94'/94" and 95'/95" on the outboard sides thereof, away from gaps SLA and SLB. The IMD layer 46 is formed on the surface of the source regions 43S, the outboard sidewalls of the stacks 94'/94" and 95'/95" of floating gates 36' and above an outboard portion of the polyoxide caps 42' of cells B1'/B1" and B2'/B2". The control gate doped polysilicon electrodes 48 are formed over the IMD layer 46 reaching over the outboard sides of stacks 94'/94" and 95'/95". The control gate polysilicon layer 48 and the IMD layer 46 have the same pattern which was produced by masking and a subtractive process such as selective chemical etching. Note that the control gate electrode layer 48 is patterned to form split gate electrodes 48A, 48B, 48C and 48D of the array of floating gate bisected stacks 94'/94" and 95'/95".

The set of four cells B1, B1', B2 and B2' have been completed by the addition of layers 46 and 48 as shown in FIG. 16B.

By mirror image, what is meant is that the split gate control gate electrodes 48 are on the outboard sides of the stacks 94'/94" and 95'/95" away from the slots SLA and SLB.

First Process

Figure 4A:
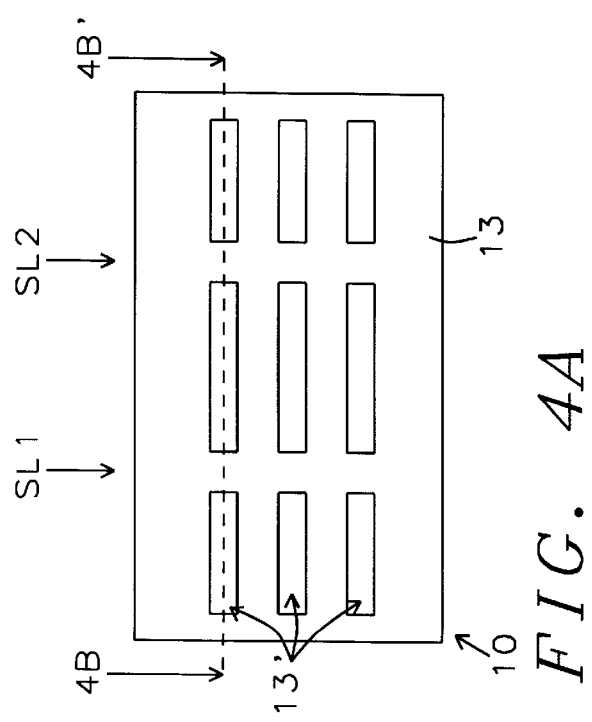
FIGS. 4A and 4B show a plan view and a sectional view of the device of FIG. 1 in an early stage of manufacture.
Figure 4B:
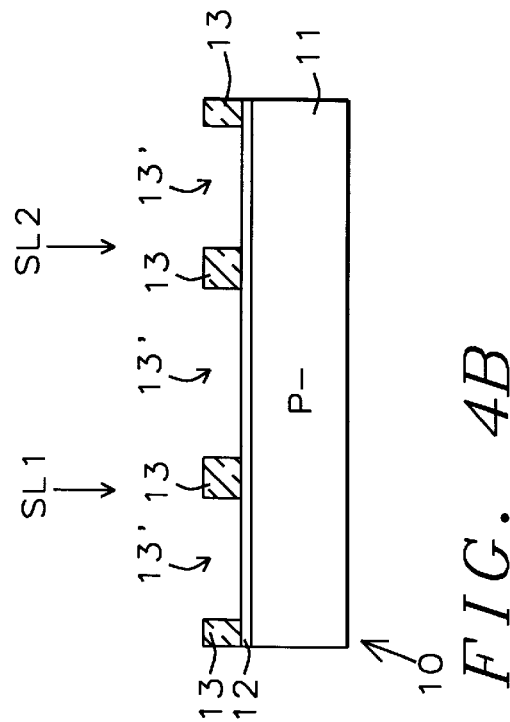

FIGS. 4A and 4B show a plan view and a sectional view of the device 10 of FIG. 1 in an early stage of manufacture. FIG. 4B is a section taken along line 4B–4B' in FIG. 4A. Device 10 is formed of a P– doped silicon substrate 11 covered with a pad oxide layer 12 covered in turn with an active region silicon nitride mask 13 with Field OXide (FOX) patterning windows 13' through mask 13 for formation and definition of the FOX regions 17 (seen in FIGS. 5A and 5B) and definition of the active regions in substrate 11, aside from the FOX regions 17. FOX regions 17 are formed through windows 13' in the silicon nitride mask 13. In FIGS. 4A, the vertically extending silicon nitride channels is between windows 13' define parallel gaps under the mask 13 for a set of parallel common source lines SL1 and SL2.

Figure 5A:
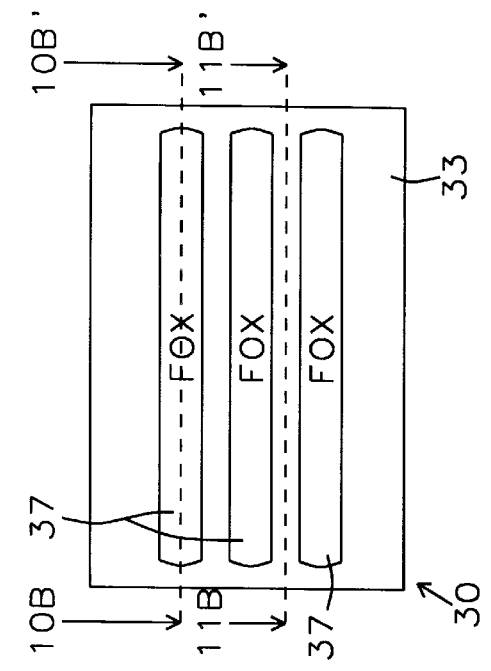
FIGS. 5A and 5B show the device of FIGS. 4A and 4B after the field oxidation step formed FOX regions in the substrate through narrow windows in a FOX mask.
Figure 5B:
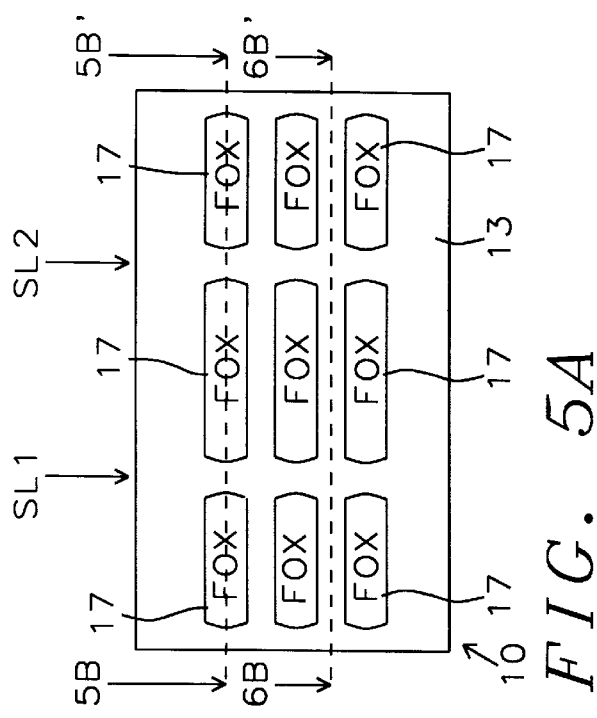

FIGS. 5A and 5B show the device 10 of FIGS. 4A and 4B after the pad oxide layer 12 has been etched through mask 13 to form windows 12' exposing the surface of substrate 11 through openings 13' in mask 13 and after the field oxidation step formed FOX regions 17 in substrate 11 through the windows 13' in silicon nitride FOX mask 13. FIG. 5B is a section taken along line 5B–5B' in FIG. 5A. There is birds beak encroachment about FOX regions 17 in the middle where source lines SL1 and SL1 are formed, where the memory cells are to be formed in subsequent steps.

FIGS. 6A and 6B show the device 10 of FIGS. 5A and 5B after the silicon nitride mask 13 and pad oxide layer 12 have been stripped from the surface of substrate 11 in steps before cell definition. FIG. 6B is a section taken along line 6B–6B' in FIGS. 5A and 6A between the FOX regions 17. Then a blanket tunnel oxide layer 14 has been formed over the exposed surfaces of substrate 11. Next, in a blanket deposition process a floating gate, first doped polysilicon layer 16 was formed blanketing the surfaces of both the tunnel oxide layer 14 and the FOX regions 17. Next, a blanket silicon nitride mask layer 21 was formed over first doped polysilicon layer 16 layer. Mask layer 21 was patterned by a photoresist mask (not shown) used to etch silicon nitride mask 21 used to form floating gate windows 21' therethrough. Then, the photoresist mask was stripped away leaving the mask layer 21 with floating gate windows 21' therethrough as seen in FIGS. 6A and 6B.

Then the portions of the surface of the first doped polysilicon layer 16 which are exposed through the floating gate windows 21' in the silicon nitride mask layer 21 are oxidized in a conventional process to form polysilicon oxide (polysilicon oxide) caps 22 over the surface of the polysilicon layer 16. Caps 22 provide a hard mask.

FIGS. 7A and 7B show the device 10 of FIGS. 6A and 6B after the silicon nitride mask layer 21 was stripped from the surface of device 10 revealing the polysilicon oxide caps 22 (hard mask) above the remainder of the first polysilicon layer 16. Note that the remainder of polysilicon layer 16 was etched away to form an array of floating gate electrode stacks 90, 91, 92 and 93, each of which includes a floating gate electrode FG over a tunnel oxide layer 14' which have been patterned by etching using the polysilicon oxide caps 22 as a mask.

FIG. 7B is a section taken along line 7B–7B' in FIG. 7A which shows the set of floating gate stacks 90, 91, 92 and 93 with slot SLI between stacks 90 and 91, spaces SL1 and SL2 between stacks 91 and 92 and slot SL2 between stacks 92 and 93 which have been formed by the etching step (for four cells C1, C2, C3 and C4 seen in FIG. 8B which are to be formed next). The first polysilicon layer 16 and tunnel oxide layer 14 were etched in a selective etching process as referred to in step 54 which etches away the exposed portions of polysilicon layer 16 while leaving a set of floating gate stacks composed of polysilicon oxide caps 22 and the floating gate electrode portions FG of polysilicon layer 16 and tunnel oxide layer 14 therebelow intact.

FIGS. 8A and 8B show the device 10 of FIGS. 7A and 7B after the formation of set of self-aligned source/drain regions 53S/53D (not shown.) In addition, InterMetal Dielectric (IMD) layer 26 has been formed over the entire device followed by a blanket deposition of the second, control gate polysilicon layer 28. Then a mask (not shown) was employed to pattern the control gate polysilicon layer 28 and the IMD layer 26 by a subtractive process such as selective chemical etching. Note that the control gate electrodes 28A, 28B, 28C and 28D are patterned to form split gate devices from the array of floating gate stacks. The result is that a set of four cells C1, C2, C3 and C4 have been completed by the addition of the split gate layers 26 and 28.

In summary, the method of FIGS. 4A-8B involves the following basic steps:
1. Define the active regions with the silicon nitride mask 13 with source lines SL1 and SL2 formed under the mask 13.
2. Form the final active region after field oxidation, with encroachment of about 0.1 μm/per side of the field oxide regions 17, and removal of silicon nitride mask 13.
3. Cell definition.
4. Define the second polysilicon layer 28 and form cell.

Second Process

Figure 9A:
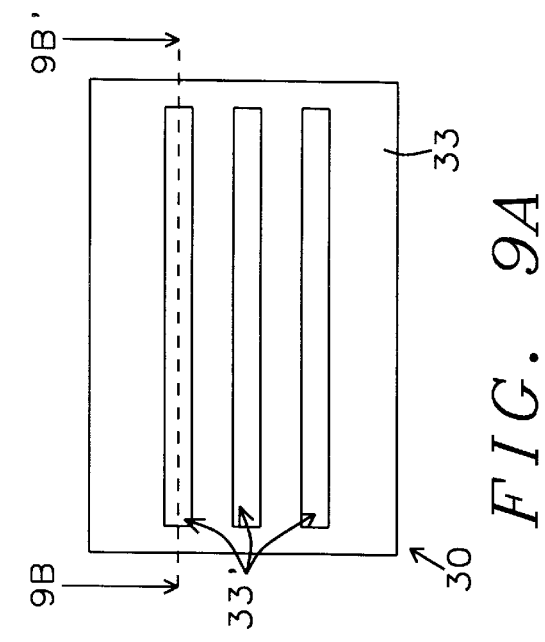
FIGS. 9A and 9B show a plan view and a sectional view of the device of FIG. 2 in an early stage of manufacture.
Figure 9B:
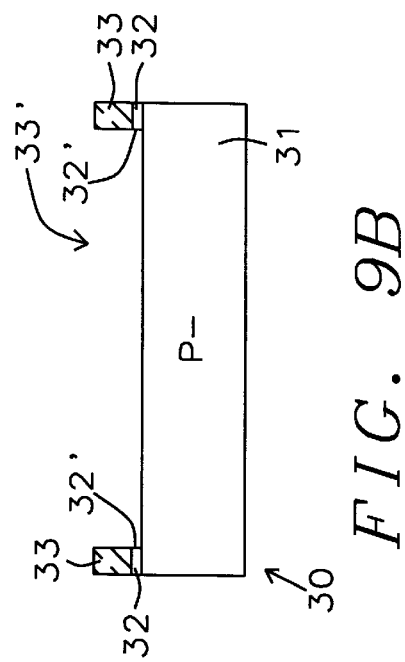

FIGS. 9A and 9B show a plan view and a sectional view of the device 30 in an early stage of manufacture. FIG. 9B is a section taken along line 9B–9B' in FIG. 9A. Device 30 is formed of a P– doped silicon substrate 31 covered with a pad oxide layer 32 covered with an active region silicon nitride mask 33 with wide Field OXide (FOX) windows 33' through mask 33 for definition of the very wide FOX regions 37 (seen in FIGS. 10A and 10B) and the active regions in substrate 31, aside from the windows 33'. The pad oxide layer 32 has been etched through mask 33 to form windows 32' exposing the surface of substrate 31 through openings 33' in mask 33. In FIGS. 9A, there is no set of vertically extending silicon nitride channels between windows 33' to define source lines for a common source region, as described in connection with FIGS. 4A and 4B. The advantage is that there is no encroachment in the middle of the stripes where the devices are to be formed in subsequent steps.

Figure 10A:
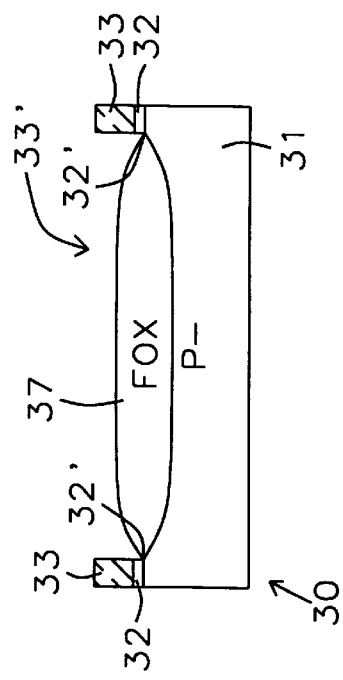
FIGS. 10A and 10B show the device of FIGS. 4A and 4B after the field oxidation step formed FOX regions in the substrate through very wide windows in a FOX mask.
Figure 10B:
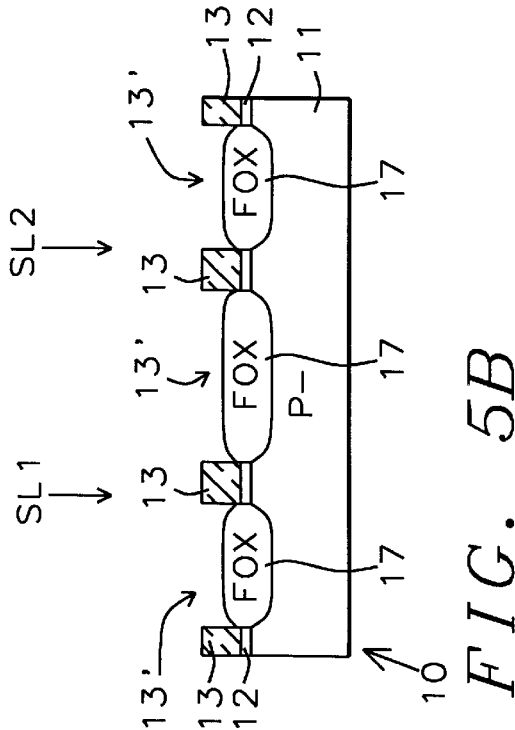

FIGS. 10A and 10B show the device 30 of FIGS. 9A and 9B after the field oxidation step formed long stripes of FOX regions 37 in substrate 31 through the windows 33' in silicon nitride FOX mask 33. FIG. 10B is a section taken along line 10B–10B' in FIG. 10A.

Note that the long stripes of FOX regions 37 of FIGS. 10A and 10B are quite different in configuration from the short FOX regions 17 in FIGS. 5A and 5B because of the omission of rows of vertically extending silicon nitride channels breaking up window 33'. Thus there is the advantage that there is no birds beak encroachment in the middle of FOX regions 37 where source lines SLA and SLB will be formed, when the memory cells are formed in subsequent steps.

Figure 11A:
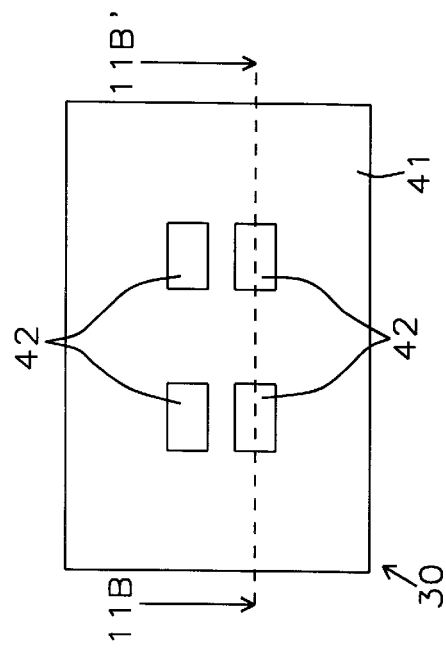
FIGS. 11A and 11B show the device 30 of FIGS. 10A and 10B after the FOX mask and pad oxide layer have been stripped from the substrate, floating gate layers have been formed on the substrate and a polyoxide cap (hard mask) has been formed on the top of the floating gate layers.
Figure 11B:
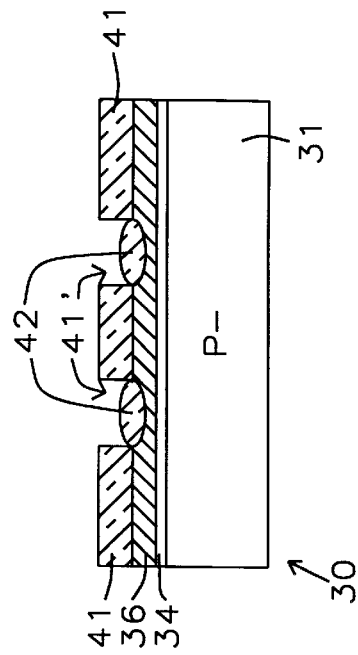

FIGS. 11A and 11B show the device 30 of FIGS. 10A and 10B after several intermediate steps. FIG. 11B is a section taken along line 11B–11B' in FIGS. 10A and 11A between the FOX regions 37.

First, the silicon nitride FOX mask 33 and pad oxide layer 32 were stripped from the surface of substrate 31 in steps before cell definition.

Then a blanket gate oxide layer 34 was formed over the exposed surfaces of substrate 31, aside from the FOX regions 37.

Next, in a blanket deposition process, a floating gate, first doped polysilicon layer 36 was formed blanketing the surfaces of both the gate oxide layer 34 and the FOX regions 37 (not shown in FIGS. 11A and 11B). Next, a blanket silicon nitride mask layer 41 was formed over first doped polysilicon layer 36 layer. Mask layer 41 has windows 41' therethrough. Windows 41' were patterned by a photoresist, cell-defining mask, not shown, and etching of silicon nitride mask 41 to form floating gate windows 41' therethrough. Then, the photoresist, cell-defining mask was stripped away leaving the mask layer 41 as seen in FIGS. 11A and 11B.

Finally, as seen in FIGS. 11A and 11B, the portions of the surface of the first doped polysilicon layer 36 which are exposed through the floating gate windows 41' in the silicon nitride mask layer 41 are oxidized in a conventional process to form polysilicon oxide (polysilicon oxide) caps 42 over the surface of the polysilicon layer 36 at the bottom of the floating gate windows 41'. Polysilicon oxide caps 42 are formed to provide a hard mask to be used for patterning a set of cell stacks 94, 95, 96, and 97 of a memory device in the steps illustrated by FIGS. 12A and 12B. FIG. 2 shows one such stack 95 split into left and right halves 95'/95" and after completion of a process in accordance with this invention.

FIGS. 12A and 12B show the device 30 of FIGS. 11A and 11B after the silicon nitride mask layer 41 was stripped from the surface of device 30. FIG. 12B is a section taken along line 12B–12B' in FIG. 12A showing that floating gate stacks 94 and 95 have been formed.

In plan view FIG. 12A, this reveals location of the hard mask caps 42 (polysilicon oxide regions) above the remainder of the first polysilicon layer 36. Note that the remainder of polysilicon layer 36 was etched away to form an array of floating gate stacks 94, 95, 96, and 97 including floating gate electrodes 36 which have been patterned by etching using the polysilicon oxide caps 42 as a set of masks. The first polysilicon layer 36 and tunnel oxide layer 34 were etched in a selective etching process which etches away the exposed polysilicon while leaving the floating gate stacks 94 and 95 composed of polysilicon oxide caps 42 and the portions of polysilicon layer 36 and tunnel oxide layer 34 therebelow intact. Note that comparing FIG. 7B to FIG. 12B, in FIG. 12B there is only one of the gate electrode stacks 94, 95, 96, or 97 of a memory device replacing two separate cells, where cell B1 replaces cells and C1 and C2 and cell B2 replaces cells C3 and C4 of the kind seen in FIG. 7B.

FIGS. 13A and 13B show the device 30 of FIGS. 12A and 12B in which a photoresist mask 43 has been formed with source line slots 43' therethrough provided in preparation for defining source lines SLA and SLB. During the process steps to follow, the gate electrode stacks 94, 95, 96, and 97 will be separated simultaneously by introducing etching materials through the slots 43' into contact with the layers below.

FIG. 13B is a section taken along line 13B–13B' in FIG. 13A showing the slots 43' reaching down to the centers of the surfaces of the hard mask caps 42'.

FIGS. 14A and 14B show the device 30 of FIGS. 13A and 13B after slots SLA and SLB have been etched through the polysilicon oxide layer caps 42, floating gate polysilicon layer 36, tunnel oxide layer 34 and field oxide regions below slots 43' in mask 43. Slots SLA and SLB are seen in FIGS. 15A and 15B between separate cells splitting each of the gate electrode stacks 94, 95, 96, or 97 in two, forming a pair of cells from those stacks. The result of forming the slots SLA and SLB in the floating gate gate electrode stacks 94, 95, 96, and 97 of tunnel oxide layers 34', floating gate electrodes 36'.

FIG. 14B is a section taken along line 14B–14B' in FIG. 14A showing how etching through the slots 431 has formed slots SLA and SLB reaching down through the centers of the surfaces of the hard mask caps 42' splitting the stacks 94 and 95 to form new stacks 94', 94'' from stack 94 and stack 95 providing floating gate stacks stacks 95', 95'.

FIGS. 15A and 15B show the device 30 of FIGS. 14A and 14B after the mask 43 has been stripped from the device 30. FIG. 15B is a section taken along line 15B–15B' in FIG. 15A. In FIG. 15B four new cells stacks 94', 94'', 95', and 95' formed from stacks 94 and 95 are shown in section. Since the devices are formed by the formation of slots SLA and SLB through the FOX strips 37, where no encroachment was possible in the middle of the strips, the birds beak sections are substantially eliminated in those portions of the devices.

FIGS. 16A and 16B show the device 30 of FIGS. 15A and 15B after the formation of InterMetal Dielectric (IMD) layer 46 has been formed over the entire device followed by a blanket deposition of the second, control gate polysilicon layer 48. Then a mask (not shown) was employed to pattern the control gate polysilicon layer 48 and the IMD layer 46 by a subtractive process such as selective chemical etching. Note that the control gate electrodes 48 are patterned to form split gate devices from the array of floating gate stacks. In addition, self-aligned source/drain regions 53S and 53D are formed by a conventional type of ion implantation process.

Figure 3A:
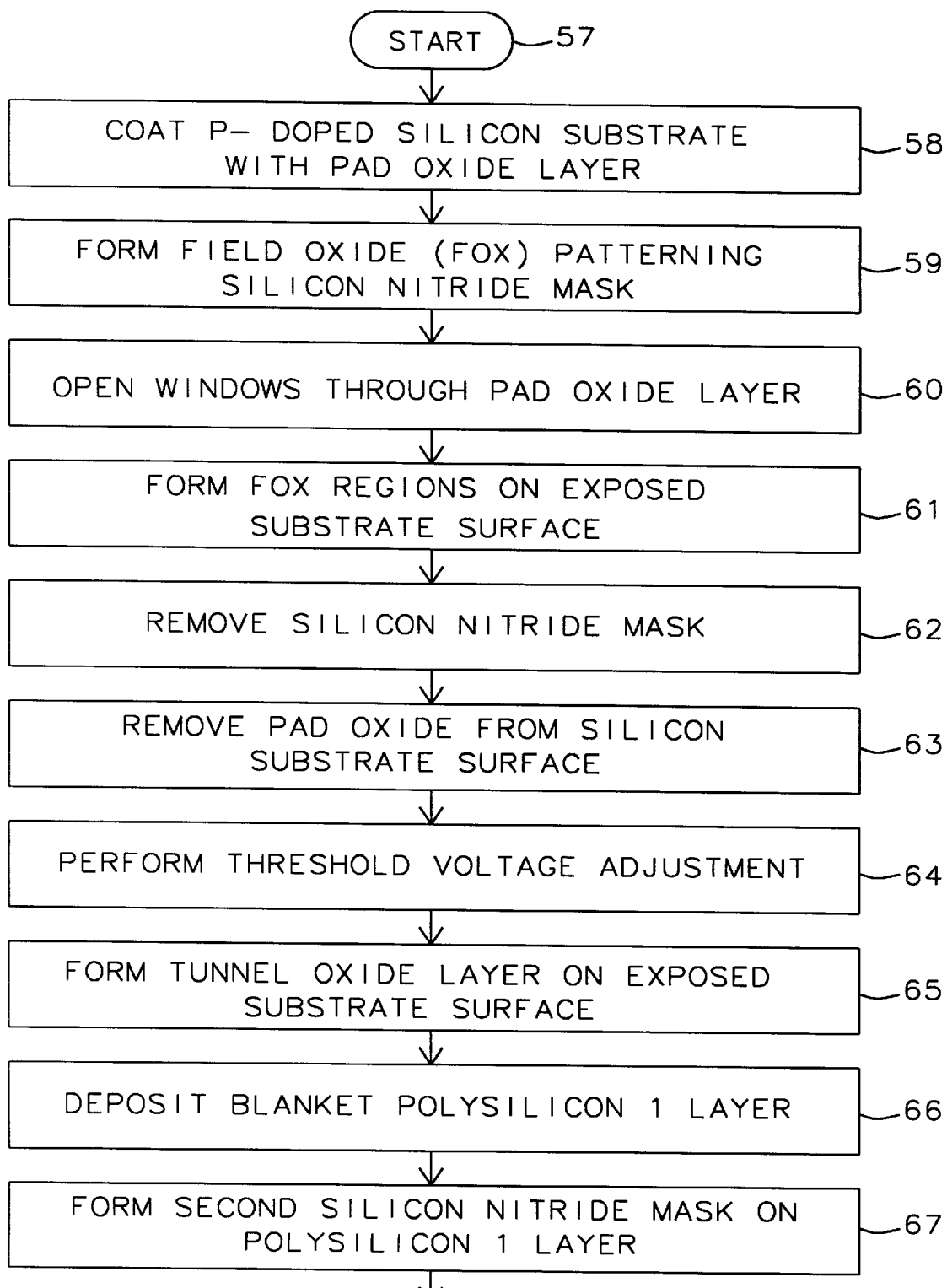
FIGS. 3A–3C show a flow chart of the embodiment of the method of this invention shown in FIGS. 9A–16B.
Figure 3B:
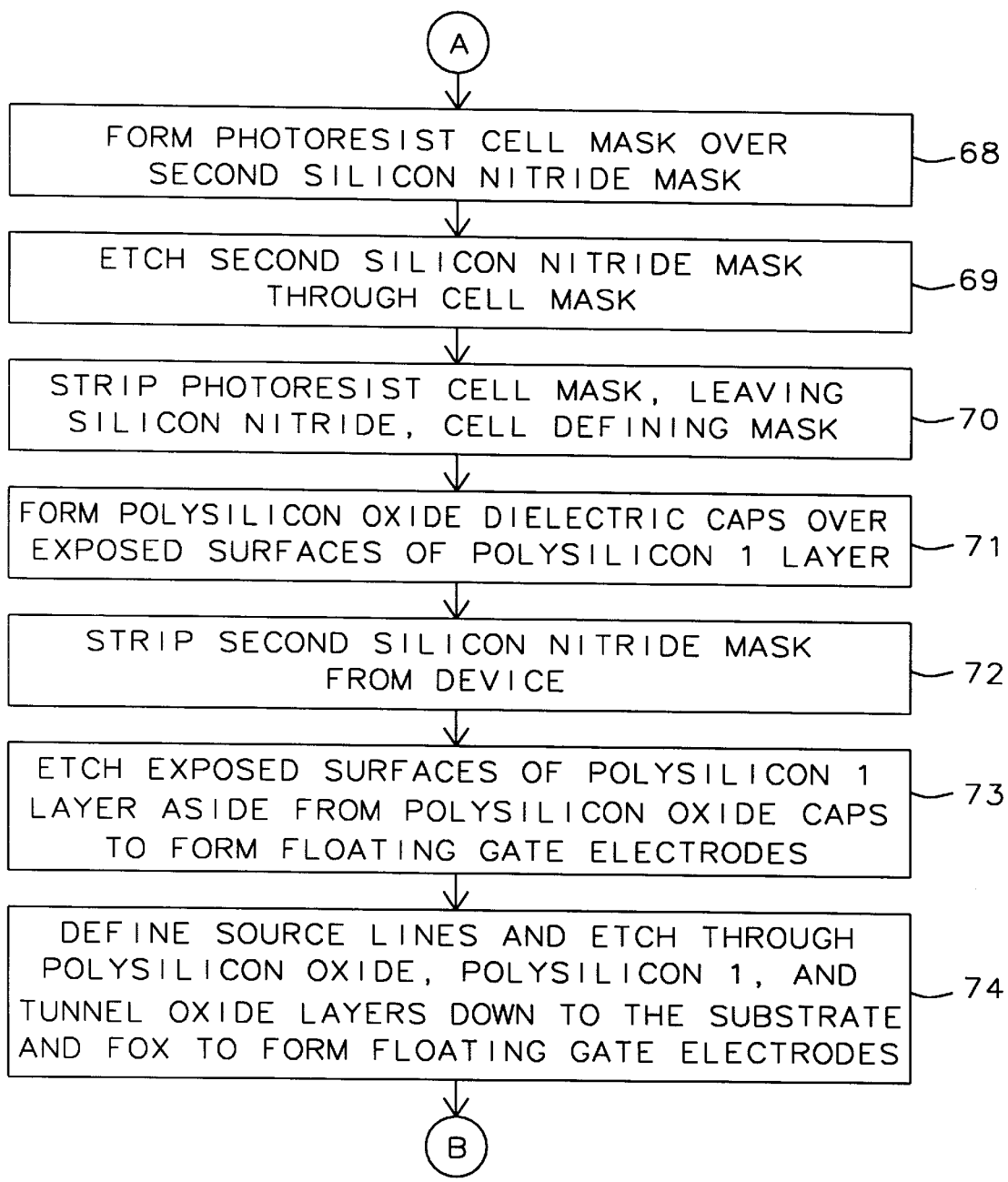
Figure 3C:
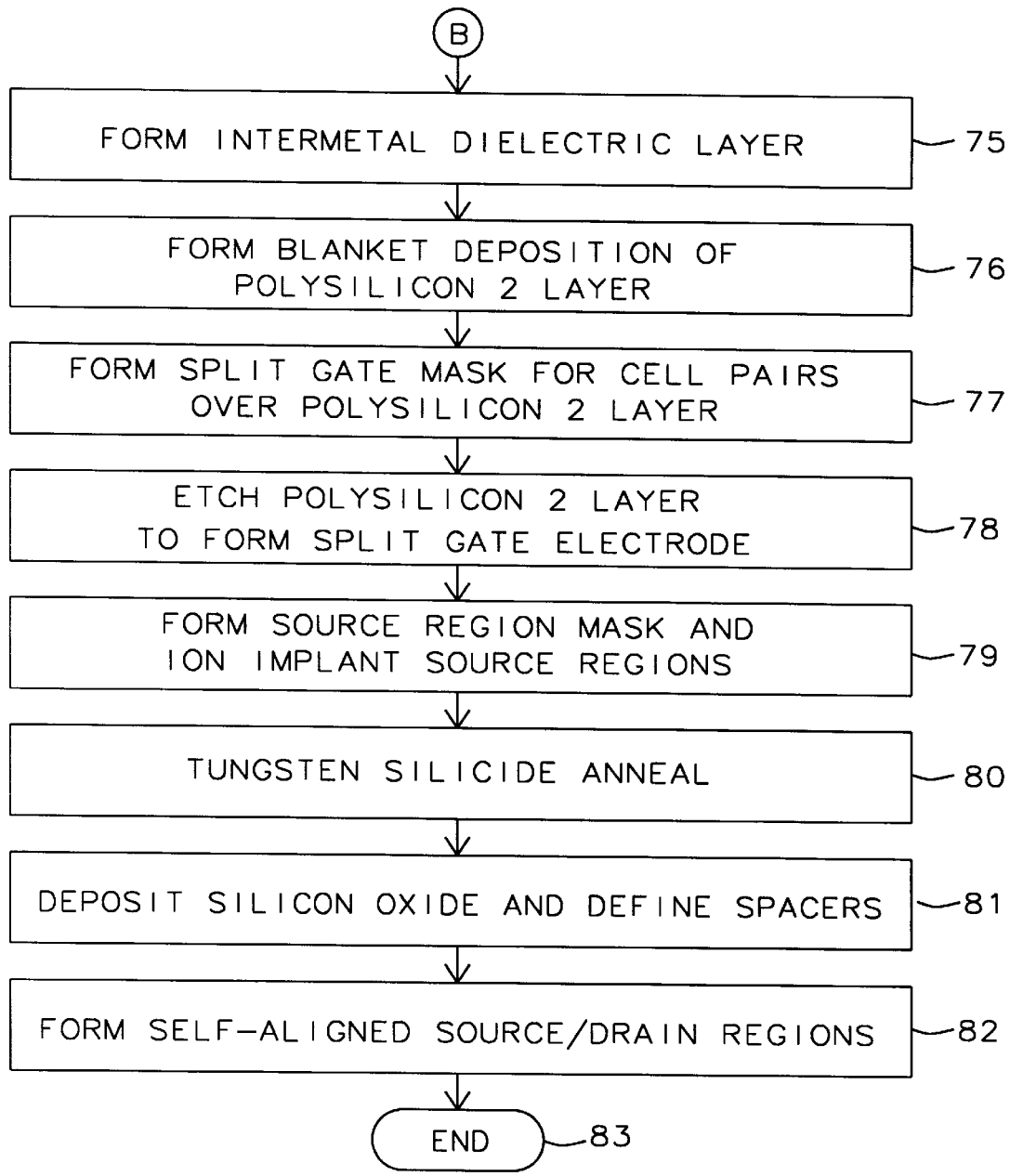

FIGS. 3A–3C show a flow chart of the embodiment of the method of this invention shown in FIGS. 9A–16A and 9B–16B.

The first step is shown in block 58 in FIG. 3A where a P-doped silicon substrate 31 is coated with a pad oxide layer 32.

In block 59, a silicon nitride mask 33, seen in FIGS. 9A and 9B, is formed over pad oxide layer 32 for the purpose of providing a pattern for formation of a field oxide (FOX) structures through with wide FOX windows 33' in mask 33.

In block 60 in FIG. 3A, windows 32' are opened through pad oxide layer 32, exposing portions of the surface of the substrate 31, as seen in FIG. 9B.

Next, in block 61, as seen in FIGS. 10A and 10B, FOX regions 37 are formed in windows 32'/33' on the exposed portions of the surface of substrate 31. FOX regions 37 extend above and below the surface of substrate 31, as seen in FIG. 10B.

Then, silicon nitride mask 33 is removed, as seen in FIG. 11B, and as described in block 62.

Next, remove pad oxide layer 32, as seen in FIG. 11B from the surface of silicon substrate 31 and as described in block 63.

Referring to block 64, then a threshold voltage adjustment is performed by ion implanting $V_T$ dopant into the active area by doping the exposed substrate 31 aside from the FOX regions 37.

In block 65, a blanket tunnel oxide layer 34 is formed next, as seen in FIG. 11B on exposed surface of substrate 31 aside from the FOX regions 37.

In block 66, the step follows of performing a blanket deposition of a first polysilicon floating gate layer 36, as seen in FIG. 11B.

In block 67, a second, cell defining, silicon nitride mask 41 is formed over floating gate polysilicon layer 36 as seen in FIGS. 11A and 11B.

FIG. 3B shows the next portion of the flow chart continuing beyond the step shown in block 67.

Referring to FIG. 3B, in block 68 the next step is formation of a photoresist cell mask (not shown) over second silicon nitride mask 41.

In block 69 the step follows of etching (or otherwise patterning) second silicon nitride mask 41 through the photoresist cell defining mask yielding the pattern in mask 41, as seen in FIG. 11B.

The next step 70 is to strip the photoresist cell defining mask leaving the silicon nitride mask 41 with windows 41' therethrough, as seen in FIG. 11B.

Then, as described in block 71, form polysilicon oxide dielectric caps 42' about 1500 Å thick on the exposed surfaces of first polysilicon floating gate layer 36 at the bottom of windows 41', as seen in FIGS. 11A and 11B. Caps 42 are formed for use in patterning of floating gate electrode stacks 94, 95, 96, and 97.

In step 72, which is next, strip second silicon nitride mask 41 from floating gate as seen in FIGS. 12A and 12B.

In block 73, etch exposed surfaces of the first polysilicon layer 36 aside from polysilicon oxide caps 42'. Exposed portions of polysilicon 36 and tunnel oxide layer 34 unprotected by polysilicon oxide caps 42 have been removed, as seen in FIGS. 12A and 12B leaving the floating gate electrode stacks 94, 95, 96, and 97.

In block 74, define source line slots SLA and SLB by etching through slots 43' in mask 43 through caps 42', and stacks (layers 36'/34') as seen in FIGS. 13A/13B. The process involves etching through polysilicon oxide layer 42, first polysilicon layer 36, tunnel oxide layer 34 and FOX regions 37 to form floating gates and source line slots SLA and SLB, as seen in FIGS. 14A/14B. Next, strip mask 43, as seen in FIGS. 15A/15B.

Referring to block 75, form InterMetal Dielectric (IMD) layer 46, as seen in FIGS. 16A/16B.

Then, referring to block 76, perform a blanket deposition of second polysilicon layer 48, as seen in FIGS. 16A/16B.

Then, as described in block 77, form a split gate electrode mask (not shown) over second polysilicon layer 48 to form mirror image cell pairs of split gate electrodes 48 as seen in FIGS. 16A/16B.

Next, etch second polysilicon layer 48 and IMD layer 46 to form control gate electrodes 48 as well as completing the split gate devices, as described in block 78.

In step 79, form a source region mask and ion implant source regions in the substrate 31 through the source line slots SLA and SLB.

In step 80, perform a tungsten silicide anneal.

Then, in step 81, deposit a spacer silicon oxide layer and etch back in the conventional manner to form spacers SP seen in FIG. 2.

Finally, referring to block 82, perform self-aligned ion implantation into substrate 31 with N-type dopant to form source/drain regions 43S/43D, as seen in FIGS. 2 and 16B.

1. In a split gate flash memory device, the shape of the active area (OD) in a memory cell is arranged in the form of isolated islands.

2. The encroachment of field oxidation in a source line has to be considered, so the active area (OD) design rule can not be easily scaled down.
3. The cells are arranged on the two sides of a source line by separated form, so the cell dimension is not easy to scale down for larger size after polysilicon oxidation.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters patent is as follows:

1. A split gate electrode MOSFET devices comprising:
   a tunnel oxide layer over a semiconductor substrate,
   a floating gate electrode layer over said tunnel oxide layer,
   a cap over said floating gate electrode layer,
   a gate electrode stack formed by said tunnel oxide layer and said floating gate electrode layer in said pattern of said cap,
   a source line slot in the center of said gate electrode stack down to said substrate splitting said floating gate electrode layer into a pair of floating gate electrodes,
   a source region formed in said substrate at the base of said source line slot,
   intermetal dielectric and control gate layers over said substrate covering said stack,
   said intermetal dielectric and control gate layers comprising adjacent mirror image split gate electrode pairs, and
   source and drain regions self-aligned with said gate electrode stack.

2. A split gate electrode MOSFET device in accordance with claim 1 comprising:
   said floating gate electrode layer comprising a doped polysilicon layer,
   said slot having a width from about 3500 Å to about 6500 Å, and
   said cap on the surface of said doped polysilicon comprising a polysilicon oxide cap.

3. A split gate electrode MOSFET device in accordance with claim 1 comprising:
   said floating gate electrode layer comprising a doped polysilicon layer,
   said cap on the surface of said doped polysilicon layer formed into polysilicon oxide cap on the surface of said polysilicon layer, and
   said tunnel oxide layer and said floating gate electrode layer having a pattern in the pattern of said cap.

4. A split gate electrode MOSFET device in accordance with claim 1 comprising:
   said floating gate electrode layer comprising a doped polysilicon layer,
   said cap on the surface of said doped polysilicon formed into polysilicon oxide cap on the surface of said doped polysilicon layer, and
   said tunnel oxide layer and said floating gate electrode layer patterned in the shape of said cap forming said floating gate electrode.

5. A split gate electrode MOSFET device in accordance with claim 1 comprising:
   long FOX regions formed in said substrate and active regions formed in said substrate below said tunnel oxide layer,
   said floating gate electrode comprising a doped polysilicon layer,
   said slot having a width from about 3500 Å to about 6500 Å,
   said cap on the surface of said doped polysilicon comprising a polysilicon oxide cap on the surface of said polysilicon layer, and
   said tunnel oxide layer and said floating gate electrode layer being patterned in the shape of said cap forming said floating gate electrode.

6. A split gate electrode MOSFET devices comprising:
   a tunnel oxide layer formed over a semiconductor substrate,
   a floating gate electrode layer formed over the tunnel oxide layer,
   a cap formed over the floating gate electrodes,
   a gate electrode stack formed by the tunnel oxide layer and the floating gate electrode layer in the pattern of the cap,
   a source line slot formed in the center of the gate electrode stack extending down to the substrate, the source line slot splitting the floating gate electrode layer into a confronting pair of floating gate electrodes,
   a source region formed in the substrate at the base of the source line slot,
   intermetal dielectric and control gate layers over the substrate covering the stack,
   the intermetal dielectric and control gate layers comprising adjacent mirror image split gate electrode pairs, and
   source and drain regions self-aligned with the gate electrode stack.

7. The split gate electrode MOSFET device of claim 6 comprising:
   the floating gate electrode layer comprising a doped polysilicon layer,
   the slot having a width from about 3500 Å to about 6500 Å, and
   the cap on the surface of the doped polysilicon layer comprising a polysilicon oxide cap.

8. The split gate electrode MOSFET device of claim 6 comprising:
   the floating gate electrode layer comprising a doped polysilicon layer,
   the cap on the surface of the doped polysilicon layer formed into polysilicon oxide cap on the surface of the doped polysilicon layer, and
   the tunnel oxide layer and the floating gate electrode layer having a pattern in the shape of the cap.

9. The split gate electrode MOSFET device of claim 6 comprising:
   the floating gate electrode layer comprising a doped polysilicon layer,
   the cap on the surface of the doped polysilicon layer formed into polysilicon oxide cap on the surface of the doped polysilicon layer, and
   the tunnel oxide layer and the floating gate electrode layer having a pattern in the shape of the cap forming the floating gate electrodes.

10. The split gate electrode MOSFET device of claim 6 comprising:

long FOX regions formed in the substrate and active regions formed in the substrate below the tunnel oxide layer, the floating gate electrode layer comprising a doped polysilicon layer, the slot having a width from about 3500 Å to about 6500 Å, the cap on the surface of the doped polysilicon comprising a polysilicon oxide cap on the surface of the polysilicon layer, and the tunnel oxide layer and the floating gate electrode layer having a pattern in the shape of the cap forming the confronting pair of floating gate electrodes.

\* \* \* \* \*